United States Patent
Scharf et al.

(10) Patent No.: US 6,431,764 B1
(45) Date of Patent: Aug. 13, 2002

(54) OPTICAL TRANSCEIVER RJ-JACK WITH EMI SHIELD

(75) Inventors: Robert M. Scharf; Randal B. Lord, both of Melbourne, FL (US)

(73) Assignee: Stratos Lightwave, Chicago, IL (US)

( * ) Notice: Subject to any disclaimer, the term of this patent is extended or adjusted under 35 U.S.C. 154(b) by 0 days.

(21) Appl. No.: 09/930,343

(22) Filed: Aug. 15, 2001

Related U.S. Application Data

(63) Continuation of application No. 09/098,227, filed on Jun. 16, 1998, now abandoned.

(51) Int. Cl.[7] .......................... G02B 6/36; H04B 10/00; H01R 13/66
(52) U.S. Cl. .......................... 385/88; 385/92; 359/152; 359/163; 439/620
(58) Field of Search .............................. 385/88, 89, 92, 385/139; 359/152, 163; 439/620, 686, 687, 692, 695, 696

(56) References Cited

U.S. PATENT DOCUMENTS

| | | | |
|---|---|---|---|
| 5,069,641 A | * 12/1991 | Sakamoto et al. | 439/620 |
| 5,518,423 A | 5/1996 | Green et al. | 439/610 |
| 5,647,767 A | 7/1997 | Scheer et al. | 439/620 |
| 5,650,917 A | 7/1997 | Hsu | 361/759 |
| 5,687,233 A | * 11/1997 | Loudermilk et al. | 439/620 |
| 5,757,998 A | * 5/1998 | Thatcher et al. | 385/89 |
| 6,062,908 A | * 5/2000 | Jones | 439/620 |
| 6,369,924 B1 | * 4/2002 | Scharf et al. | 359/152 |

OTHER PUBLICATIONS

Fastpulse High Speed Lan Transceiver Brochure H309.A (Jul. 1996).
Valor Datasheet MD6304 Series (Sep. 1997)Quad 10/100Base–TX Filtered Connector Module.
Valor datasheet MD6301 Series (Sep. 1997)Single 10/100Based–TX Filtered Connector Module.
Level One datasheet LXT915 (Apr. 1997) Revision 2.0 Simple Quad Ethernet Repeater.

\* cited by examiner

*Primary Examiner*—Rodney Bovernick
*Assistant Examiner*—Juliana K. Kang
(74) *Attorney, Agent, or Firm*—Steven M. Evans

(57) ABSTRACT

A communications transceiver includes a jack housing which, in turn, includes portions defining a recess for receiving a mating plug therein. Signal connector elements are provided within the recess for establishing inbound and outbound signal paths with corresponding signal connector elements of the mating plug. A circuit board within the jack housing preferably comprises an electrically conductive layer defining a first internal electromagnetic interference (EMI) shield. Accordingly, at least one first circuit device being susceptible to EMI is mounted on a first side of the circuit board, and at least one second circuit device generating EMI and is mounted on the circuit board on a second side thereof opposite the first side. The first internal EMI shield extends between the at least one first circuit device and the at least one second circuit device. The transceiver may include an electrically conductive layer on outer surface portions of the jack housing defining an external EMI shield. And the first internal EMI shield may be electrically connected to the external EMI shield. The transceiver may operate over an optical fiber path or a twisted pair path.

9 Claims, 11 Drawing Sheets

US 6,431,764 B1

OPTICAL TRANSCEIVER RJ-JACK WITH EMI SHIELD

CONTINUATION APPLICATION

This is a continuation application of the parent U.S. patent application having Ser. No. 09/098,227, filed on Jun. 16, 1998, now abandoned.

FIELD OF THE INVENTION

The present invention relates to the field of communications electronics, and, more particularly, to a communications transceiver and related methods.

BACKGROUND OF THE INVENTION

Digital communications over twisted copper wire pairs, or optical fiber pairs, are widely used for Local Area Networks (LANs), for example. The LAN typically connects multiple computer users to a server or other computer. A LAN transceiver, that is, a combination transmitter and receiver, is used to transmit data and receive data over the twisted pair or fiber pair.

One typical line of such high speed LAN transceivers is made by Pulse of San Diego, Calif. under the part number designations PE-68531G, PE-68532G, PE-68538G, and PE-68537G. Another similar line of transceiver are offered by Valor Electronics of San Diego, Calif. Different transceiver models are generally made to be compatible with existing communications standards, such as those of ANSI, IEEE, and ATM.

A typical LAN transceiver for communications over a twisted wire pair typically includes a jack housing having a recess for receiving a mating plug. The housing also typically contains a printed circuit board for mounting various components. A series of electrical conductors are carried within the recess and engage mating conductors on the plug. One common arrangement provides the circuit components within a jack housing that is compatible with an so-called "RJ-45" jack.

Transformers are typically mounted on the circuit board along with one or more active components, such as signal processing integrated circuits, for example. Filters and termination devices are connected to the transformers and positioned within the jack housing. Transmit and receive circuit components are connected to the respective filters and terminations. For the outbound or transmit direction, the transmitter electronics may include an encoder and a transmit amplifier. In the receive or inbound direction, the electronics may include an automatic gain control (AGC) amplifier, adaptive equalizer and decoder. In addition, a baseline restoration circuit may be connected to the decoder and a signal detect circuit coupled to the output of the adaptive equalizer. A series of such transceivers may be mounted on a mother circuit board to further process the signals.

Of course, shielding of various circuit components may be important for a high speed LAN transceiver. In particular, the transceivers made by Pulse may be supplied with an overall metallic case or shield to reduce electromagnetic interference (EMI) to other adjacent components and vice-versa. U.S. Pat. No. 5,518,423 to Green et al. also discloses a number of arrangements for an external housing shield.

Unfortunately, the functions being performed by the electronics within the relatively small housing the size of an RJ-45 jack has been increasing. Where only magnetics were once included within the housing, active electronics circuits are also provided. The active electronic components may be susceptible to EMI generated by the magnetic components for a twisted pair transceiver. Similarly, an optical transceiver may experience undesirable EMI coupling between the transmitter portion and the receiver circuit portion. Individual shields for the components may be ineffective or be difficult to assemble and thereby greatly add to the cost of manufacturing.

SUMMARY OF THE INVENTION

In view of the foregoing background, it is therefore an object of the present invention to provide a communications transceiver and associated method wherein the components or devices are less susceptible to EMI.

It is another object of the invention to provide a communications transceiver and associated method resistant to EMI and that is compact and is compatible with existing RJ-45 jacks and plugs.

These and other objects, features and advantages in accordance with the present invention are provided by a communications transceiver comprising a jack housing including portions defining a recess for receiving a mating plug therein, signal connector means within the recess for establishing inbound and outbound signal paths with corresponding signal connector means of the mating plug, and a circuit board within the jack housing and connected to the connector means. Moreover, the circuit board preferably comprises an electrically conductive layer defining a first internal electromagnetic interference (EMI) shield. Accordingly, at least one first circuit device being susceptible to EMI is mounted on a first side of the circuit board, and at least one second circuit device generating EMI is mounted on the circuit board on a second side thereof opposite the first side. The first internal EMI shield extends between the at least one first circuit device and the at least one second circuit device.

The transceiver may include an electrically conductive layer on outer surface portions of the jack housing defining an external EMI shield. The first internal EMI shield may be electrically connected to the external EMI shield.

The jack housing is preferably compatible with an RJ-45 jack. In addition, the transceiver preferably includes a plurality of electrically conductive pins connected to the circuit board and extending outwardly from the jack housing in an arrangement compatible with an RJ-45 jack. The pins may extend generally parallel to the circuit board.

In one embodiment, the signal connector means comprises a plurality of electrical contacts, and the at least one first circuit device comprises an active device, such as an integrated circuit. The IC may perform amplification analog-to-digital and/or digital-to-analog conversion. The IC may accept a digital input signal and produce a digital output signal so that no analog signals are needed on the external mother board.

The at least one second circuit device preferably comprises at least one magnetic device. Accordingly, the EMI susceptible active IC is shielded from the relatively noisy magnetics.

According to another aspect of the invention, the communications transceiver may include at least one filter/termination device mounted on the circuit board adjacent the at least one active device. An electrically conductive member may be provided defining a second internal EMI shield between the at least one filter/termination device and the at least one active device.

In another embodiment of the invention, the signal communication is over a pair of optical fibers. In other words, in this embodiment, the signal path connector means comprises an optical detector for inbound optical signals, and an optical emitter for outbound optical signals. Thus, the at least one first circuit device preferably comprises a receiver circuit device, such as a receiver IC, connected to the optical detector. The receiver IC typically includes high gain amplification circuitry that is susceptible to EMI. The at least one second circuit device in this optical embodiment preferably comprises a transmitter circuit device connected to the optical emitter. The transmitter may also be in the form of an IC. The internal EMI shield carried by the circuit board protects the receiver from EMI generated by the transmitter.

A method aspect of the invention is for making a communications transceiver of a type comprising a jack housing including portions defining a recess for receiving a mating plug therein, signal connector means within the recess for establishing inbound and outbound signal paths with corresponding signal connector means of the mating plug, and a circuit board within the jack housing and connected to the connector means. The method preferably comprises the steps of: providing the circuit board with an electrically conductive layer defining a first internal electromagnetic interference (EMI) shield; positioning at least one first circuit device being susceptible to EMI on a first side of the circuit board; and positioning at least one second circuit device generating EMI on the circuit board on a second side thereof opposite the first side so that the first internal EMI shield extends between the at least one first circuit device and the at least one second circuit device.

The method may also include the step of providing an electrically conductive layer on outer surface portions of the jack housing defining an external EMI shield, and electrically connecting the first internal EMI shield to the external EMI shield. In one preferred embodiment, the jack housing and output pins are compatible with an RJ-45 jack.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. Prime and double prime notation is used to indicate similar elements in alternate embodiments.

Figure 1:
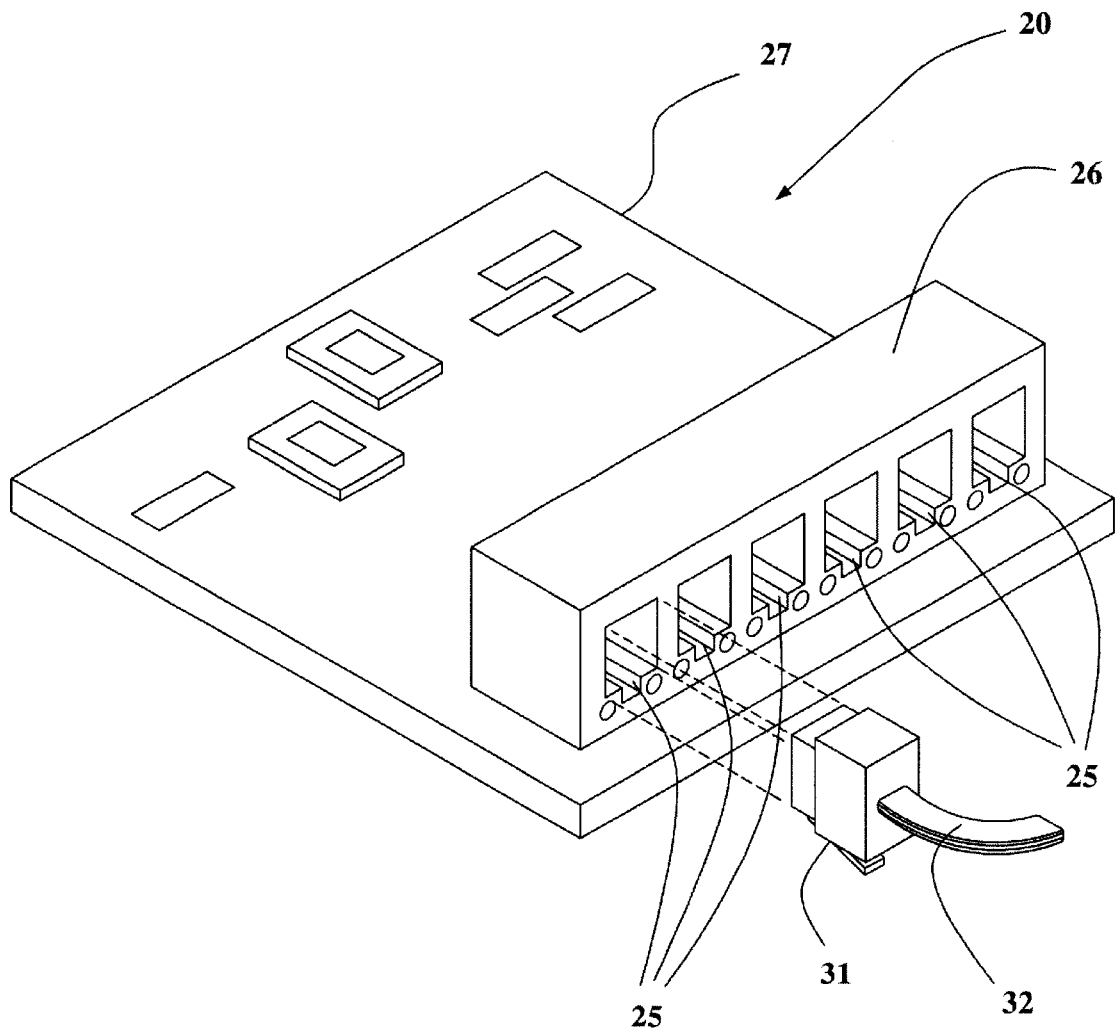
FIG. 1 is a perspective view of a portion of a circuit board including an assembly of transceivers thereon in accordance with the present invention.

An assembly or module 26 of communications transceivers 25 in accordance with the present invention is illustrated in the communications system portion 20 of FIG. 1. The assembly 26 is mounted on a mother circuit board 27 as will be readily appreciated by those skilled in the art. Each of the transceivers 25 may receive a mating plug 31. The mating plug 31 is, in turn, connected to a cable 32 which may include copper wires, such as in the form of one or more twisted pairs of wires. The cable 32 may also contain one or more optical fibers, such as a pair of optical fibers, as will be readily appreciated by those skilled in the art.

Referring now additionally to FIGS. 2–6, a first embodiment of the communications transceiver 25 for operation over a twisted pair is explained. The transceiver 25 includes a jack housing 33 including portions defining a recess 34 for receiving a mating plug 31 therein. The jack housing 33 is preferably molded plastic as will be readily appreciated by those skilled in the art.

In this illustrated embodiment, signal connector means in the form of a plurality of electrical contacts or conductors 36 are mounted within the recess 34 for establishing inbound and outbound signal paths with corresponding signal conductors of the mating plug 31, as will be readily appreciated by those skilled in the art. The conductors 36 are typically biased downwardly to engage corresponding conductors of the plug as will also be readily appreciated by those skilled in the art.

A circuit board 38 is positioned within the jack housing 33 and traces or conductive paths on the circuit board are connected to the conductors 36. The circuit board 38 is positioned to extend in a vertical orientation spanning the full dimensions of the interior of the jack housing 33. The circuit board 38 illustratively includes an electrically conductive layer 42 sandwiched between first and second dielectric layers 43 thereby defining a first internal electromagnetic interference (EMI) shield. Other conductive traces, not shown, are typically provided on the outer surfaces of the dielectric layers 43 as will be readily appreciated by those skilled in the art. In addition, electrical connections may be established extending through the first internal EMI shield 42.

The jack housing 33 is preferably compatible in size and shape with an RJ-45 jack as will be appreciated by those skilled in the art. The transceiver 25 illustratively includes a plurality of electrically conductive pins 47 connected to the circuit board 38 and extending outwardly from the jack housing 33 in an arrangement compatible with an RJ-45 jack transceiver. The pins 47 may extend generally parallel to the circuit board 38 and in two rows as shown perhaps best in the bottom plan view of FIG. 6. The transceiver 25 also includes stake posts 53 to facilitate mounting to the mother circuit board 27, for example, and as will be readily appreciated by those skilled in the art.

The transceiver 25 may also include an electrically conductive layer 50 on outer surface portions of the jack housing 33 defining an external EMI shield. As shown schematically in FIG. 3, the first internal EMI shield 42 may be electrically connected to the external EMI shield 50. The external EMI shield 50 may be connected to the mother circuit board 27 via the illustrated pins 56.

In accordance with the present invention, at least one first circuit device being susceptible to EMI is mounted on a first side of the circuit board 38, and at least one second circuit device generating EMI is mounted on the circuit board on a second side thereof opposite the first side. The first internal EMI shield 42 extends between the at least one first circuit device and the at least one second circuit device.

In the first illustrated embodiment, the EMI susceptible device or component is an active circuit, such as in the form of the illustrated active integrated circuit 45. The active IC 45 performs a number of functions according to the respective communications protocol being implemented; however, it typically includes a high gain amplifier stage that is susceptible to EMI, for example.

In one preferred embodiment, the active IC 45 performs analog-to-digital conversion of the inbound signal, and digital-to-analog conversion of the outbound signal, so that only digital signals are routed to and processed by the mother circuit board 27 (FIG. 1). In other words, the active IC 45 may perform amplification, analog-to-digital and/or digital-to-analog conversion. The active IC 45 may accept a digital input signal and produce a digital output signal so that no analog signals are carried on the external mother board.

In the first illustrated embodiment which communicates over a twisted wire pair, the at least one second circuit device comprises at least one magnetic device 60. The magnetic devices or magnetics 60 typically includes transformers as will be readily understood by those skilled in the art. The first internal EMI shield 42 is positioned to extend between the EMI susceptible active IC 45 and the relatively high EMI generating magnetics 60. The relative positions of the active device 45 and the magnetics 60 could be switched to be on reversed sides of the circuit board 38 in another embodiment of the invention. This internal EMI shield 42 provides a compact arrangement for an RJ-45 compatible transceiver 25. The internal shield in the form of the electrically conductive layer 42 of the mounting circuit board 38 greatly simplifies assembly—particularly as compared to one or more separately installed shields for the magnetics 60. In other words, an assembler need not fumble with a relatively small shield to ensure its correct placement in the jack housing 33.

Figure 2:
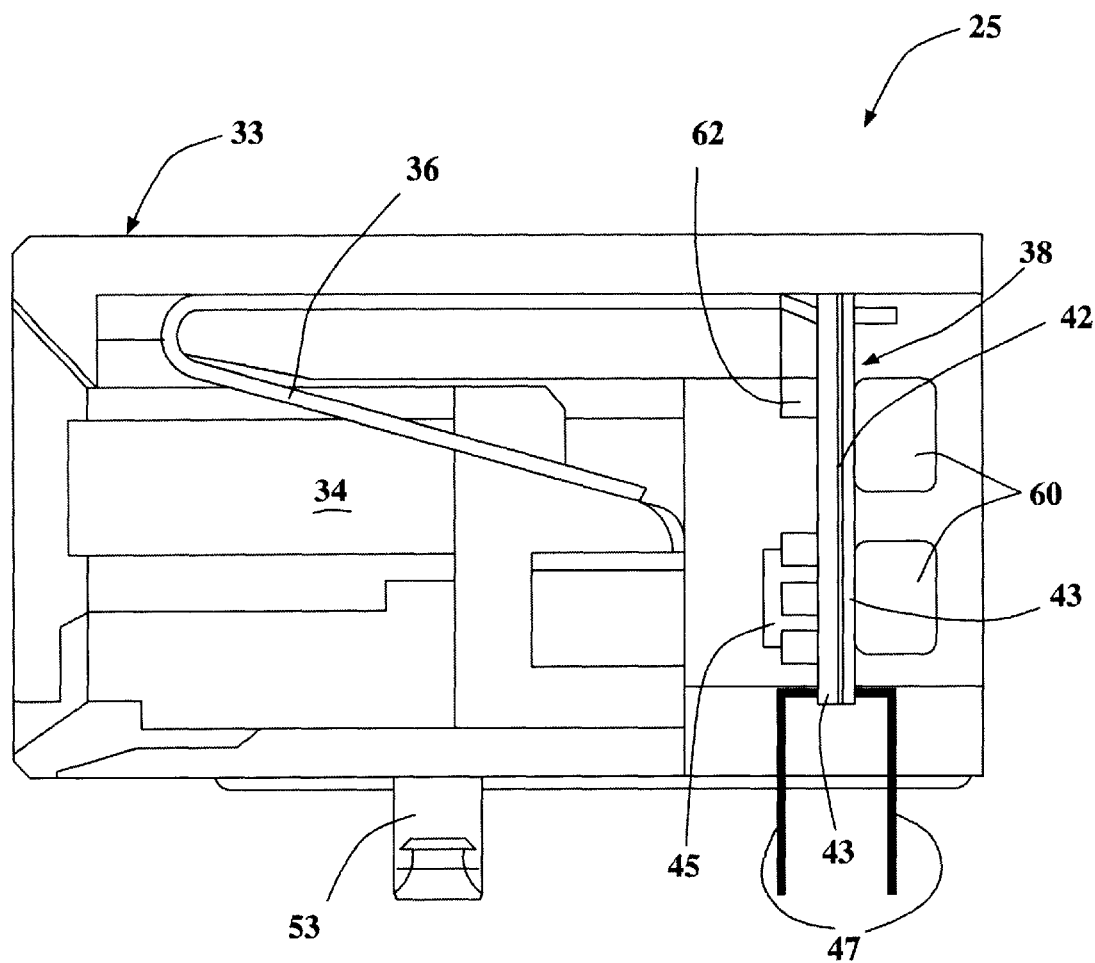
FIG. 2 is a longitudinal cross-sectional view of one of the transceivers as shown in FIG. 1.
Figure 3:
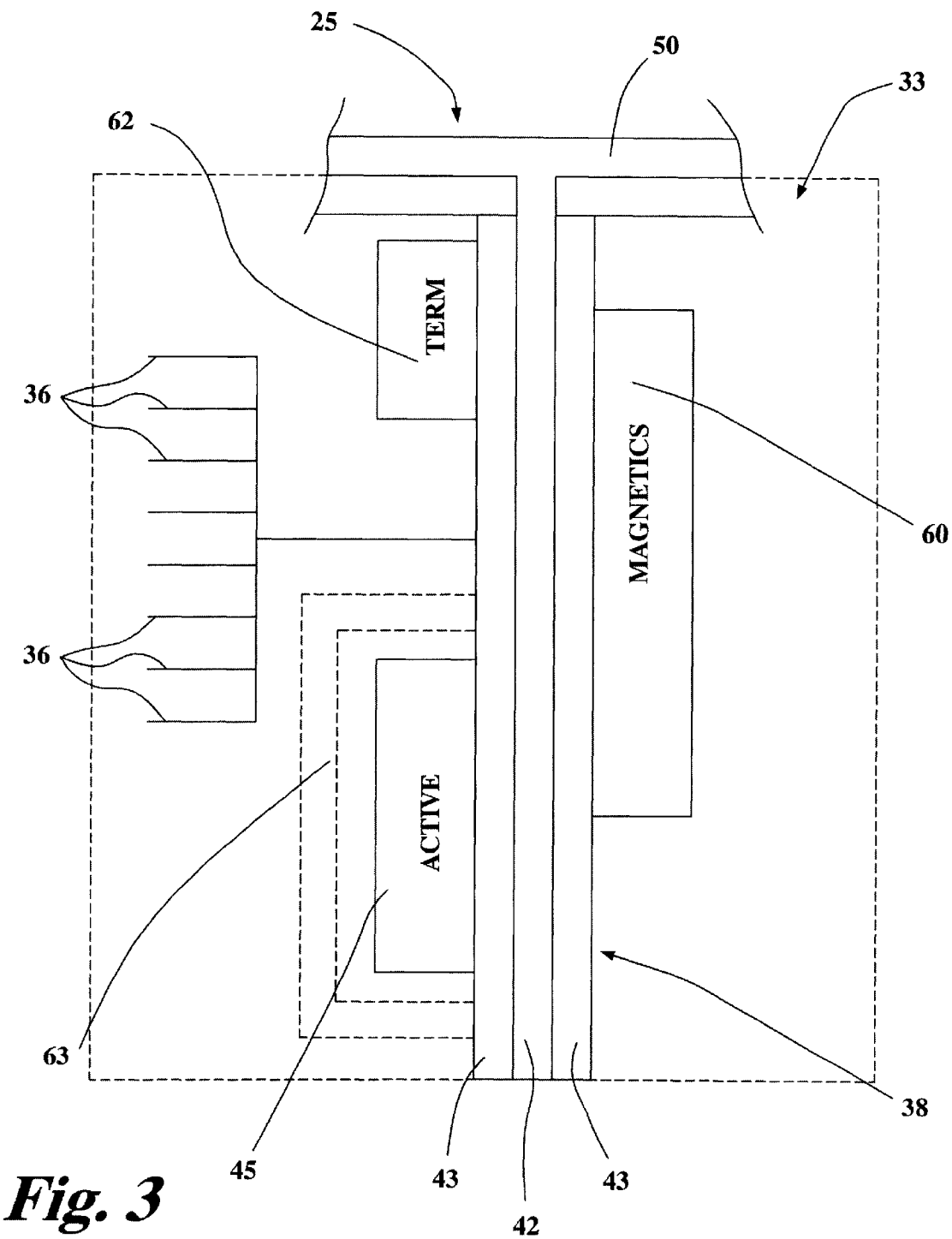
FIG. 3 is a schematic view, partially in section, of e shown in FIG. 2.
Figure 4:
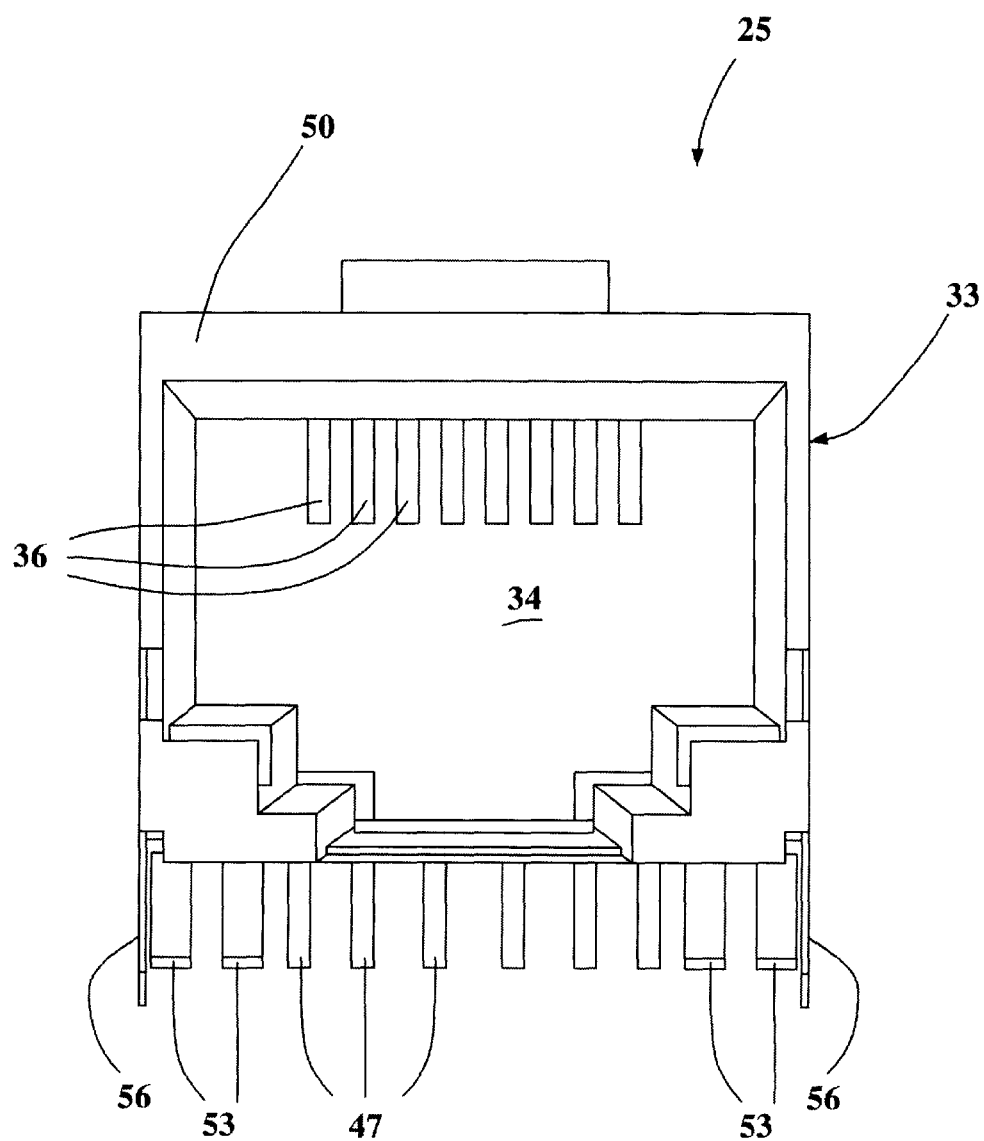
FIG. 4 is a front elevational view of the transceivers as shown in FIG. 2.
Figure 5:
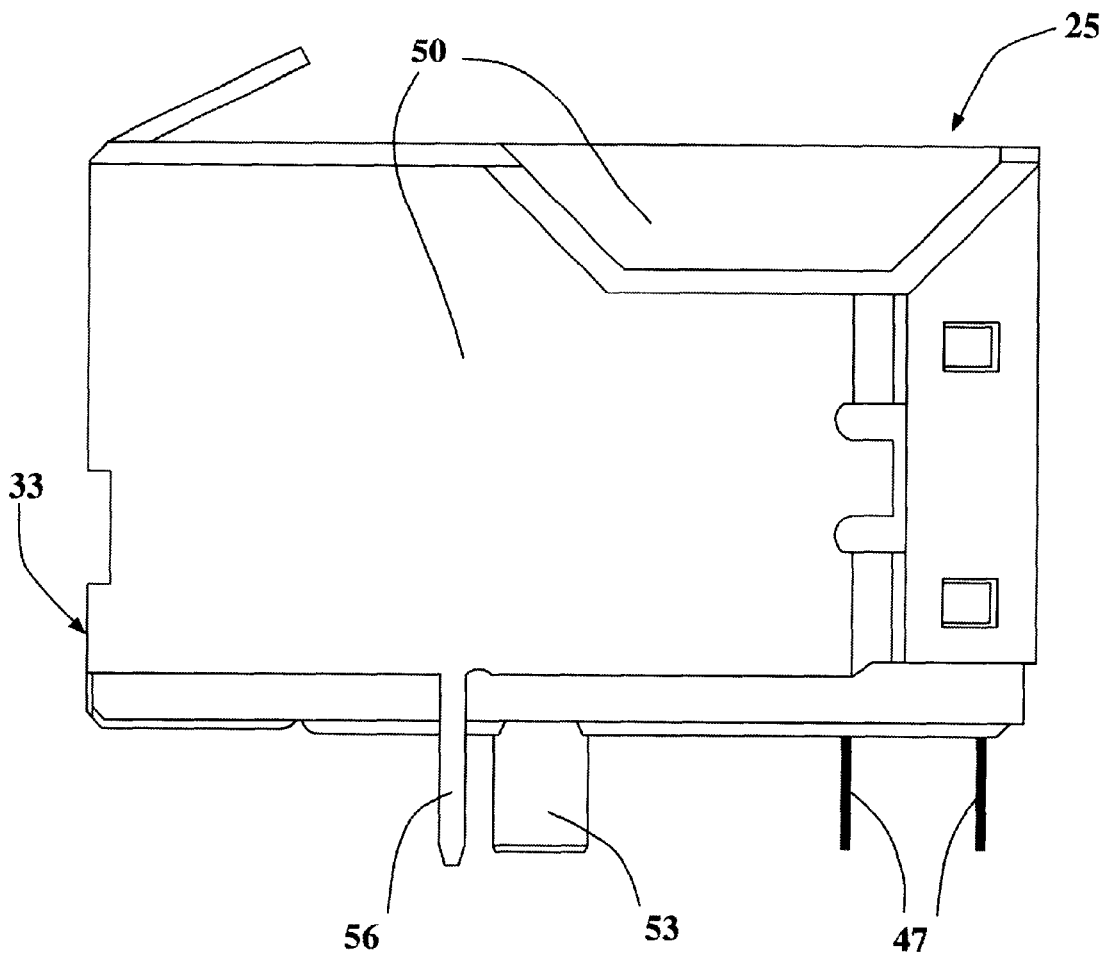
FIG. 5 is a side elevational view of the transceivers as shown in FIG. 2.
Figure 6:
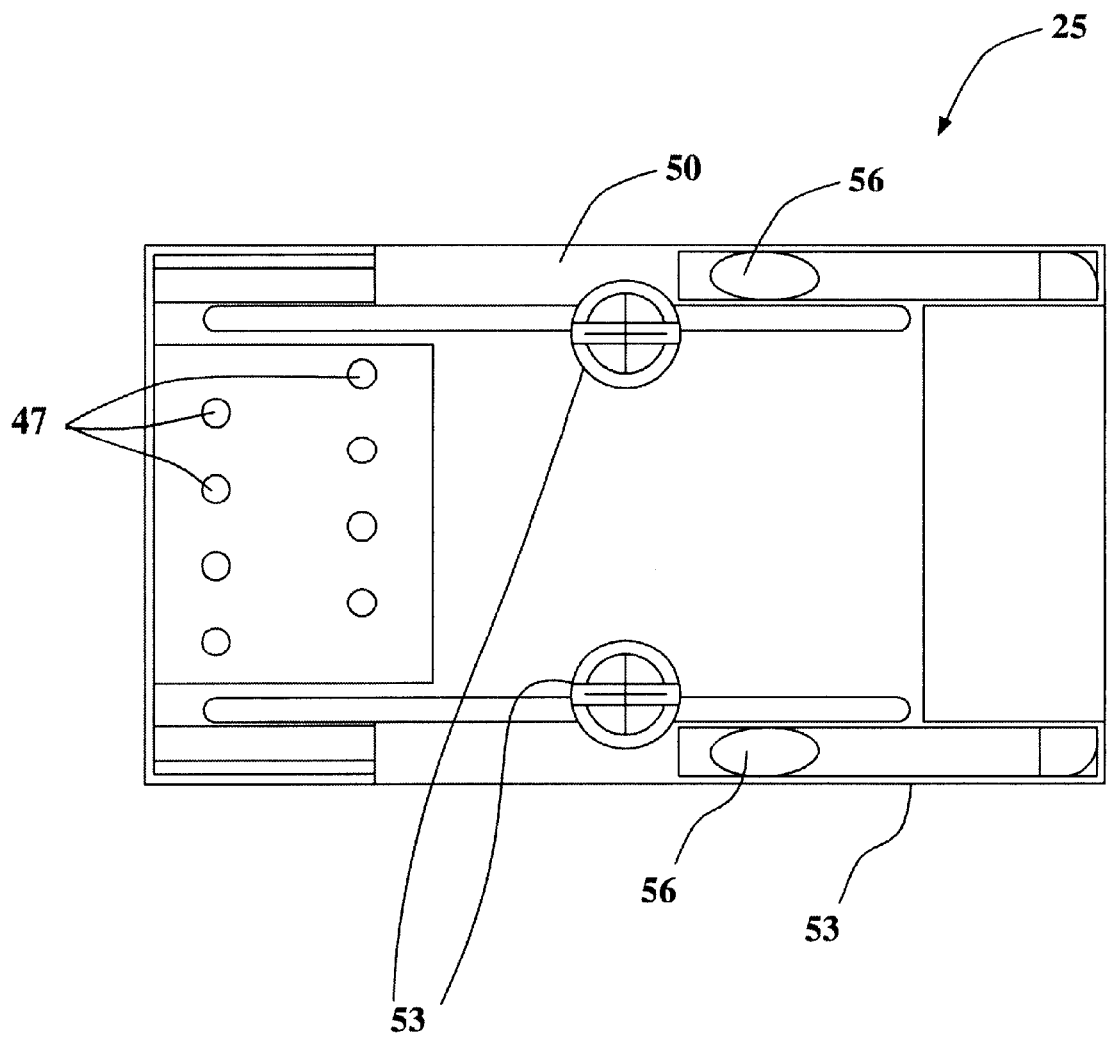
FIG. 6 is a bottom plan view of the transceiver shown in FIG. 2.
Figure 7:
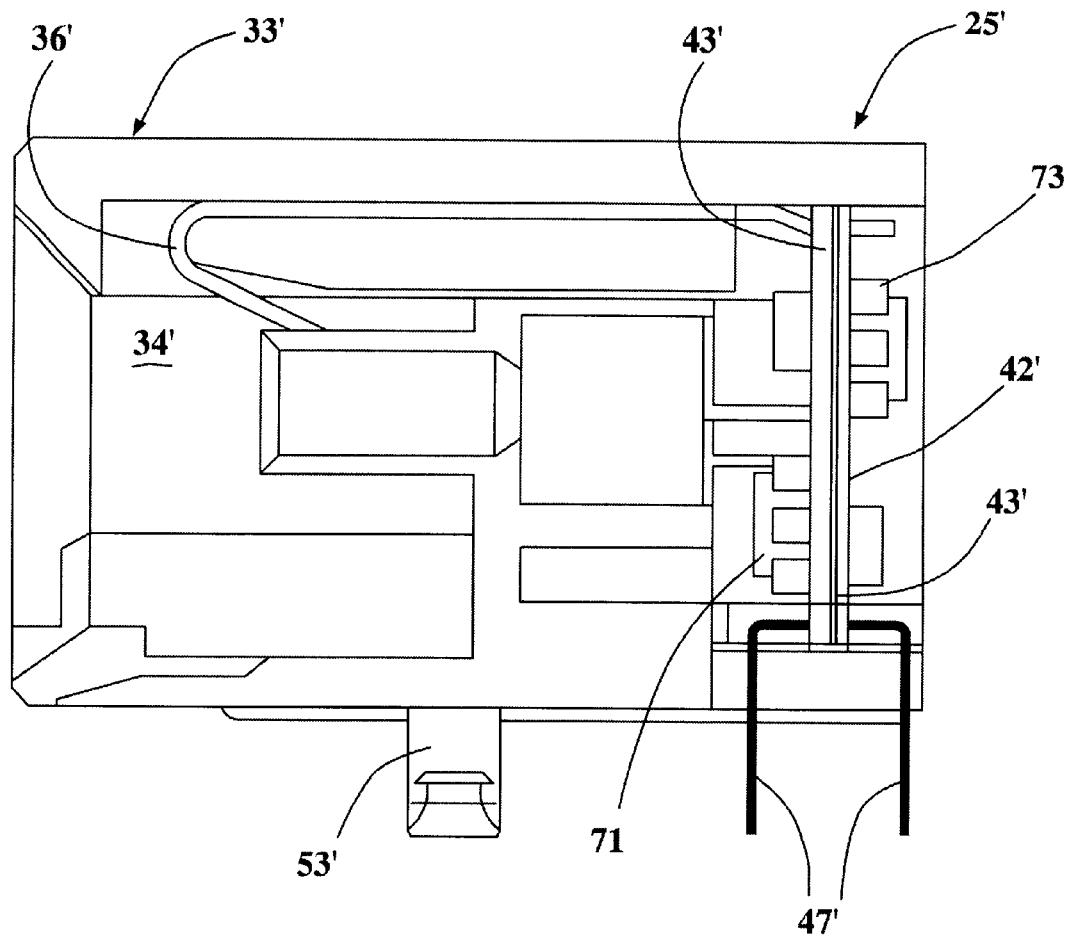
FIG. 7 is a longitudinal cross-sectional view of an optical version of a transceiver in accordance with the present invention.
Figure 8:
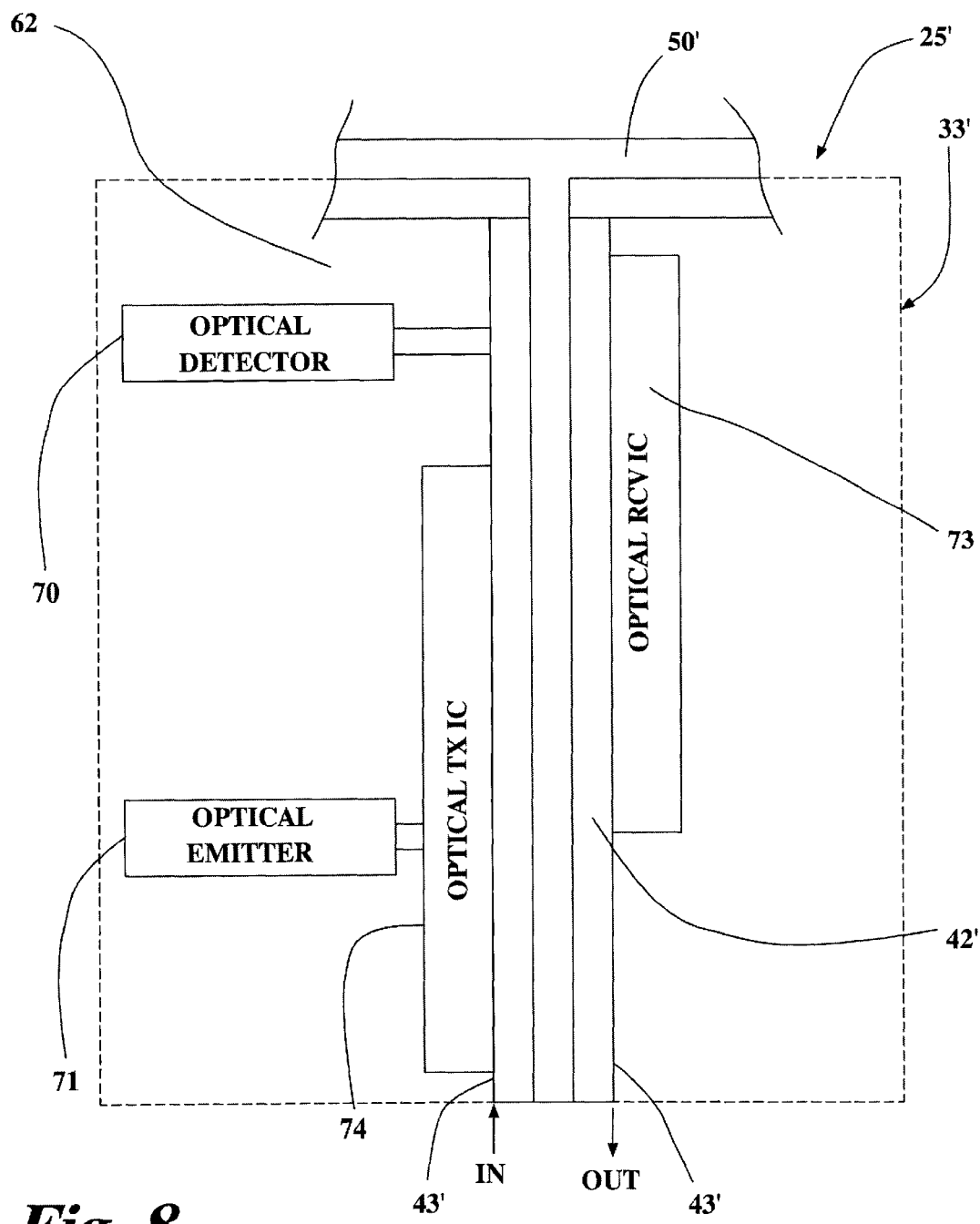
FIG. 8 is a schematic view, partially in section, of the transceiver shown in FIG. 7.
Figure 9:
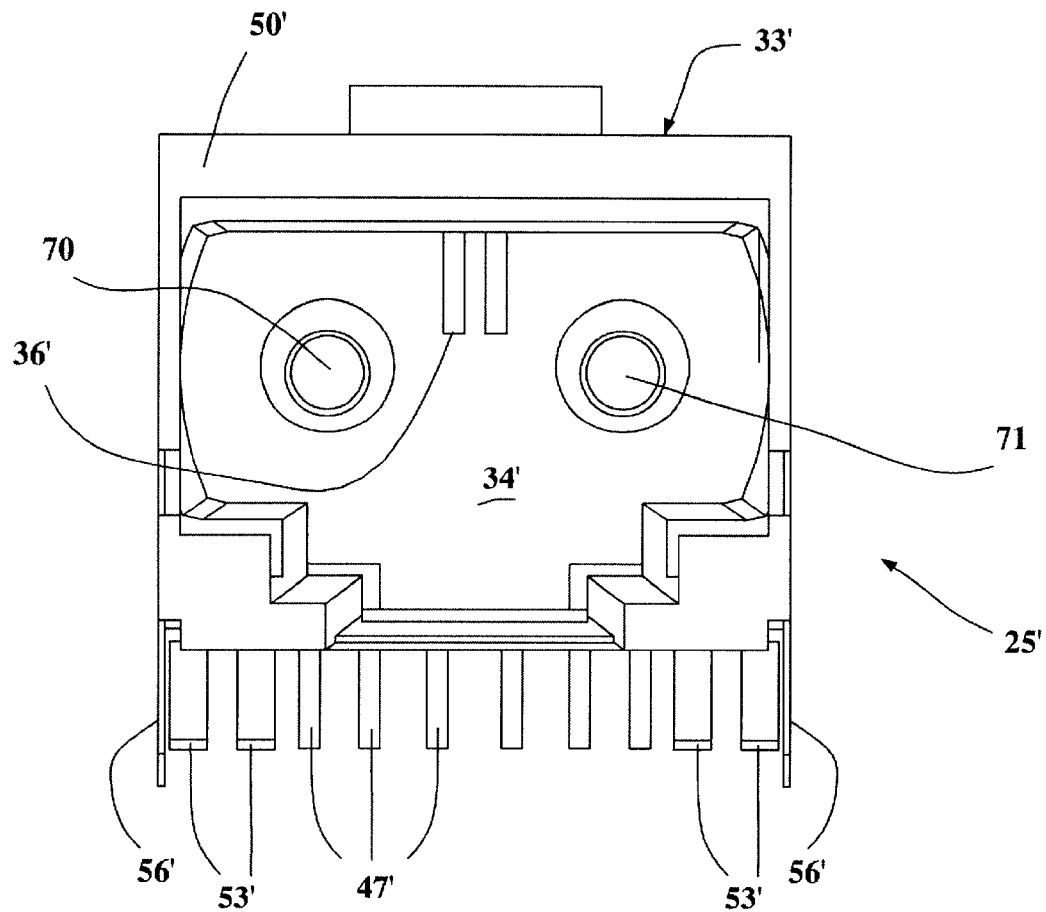
FIG. 9 is a front elevational view of the transceiver as shown in FIG. 7.

According to another aspect of the invention as shown in FIGS. 2 and 3, the communications transceiver 25 may include at least one filter/termination device 62 mounted on the circuit board 38 adjacent the at least one active device 45. In the illustrated embodiment, the filter/termination device 62 is on the same side of the circuit board 38 as the active IC 45. If desired, an electrically conductive member 63 may be provided defining a second internal EMI shield between the at least one filter/termination device 62 and the at least one active device 45.

Turning now to FIGS. 7 to 10, another embodiment of a communications transceiver 25' in accordance with the invention is now described. In this embodiment, the transceiver 25' communicates over a pair of optical fibers as will be readily appreciated by those skilled in the art. Considered in somewhat different terms, the signal path connector means comprises an optical detector 70 for inbound optical signals, and an optical emitter 71 for outbound optical signals as shown schematically in FIG. 8. In this embodiment at least one first circuit device that is susceptible to EMI is a receiver circuit device, such as a receiver IC 73, connected to the optical detector 70. The receiver IC 73, as would be readily understood by those skilled in the art, typically includes high gain amplification circuitry that is susceptible to EMI. Of course, other signal processing circuitry may also be susceptible to EMI as will also be readily appreciated by those skilled in the art.

The at least one second circuit device in this optical embodiment of the communications transceiver 25' also illustratively includes a transmitter circuit device connected to the optical emitter 71. The transmitter device is illustratively in the form of a transmitter IC 74. The first internal EMI shield 42' reduces undesired coupling of EMI from the high speed, high power circuitry of the transmitter IC 74 from interfering with the high gain amplification and signal processing circuitry of the receiver IC 73. While the transmitter IC 74 is shown on the inside of the circuit board 38' and the receiver IC 73 is on the outside, these relative positions could be reversed, as long as these devices are on opposite sides of the first internal EMI shield 42'. Electrical conductors 36' are shown in the illustrated embodiment, but may be deleted in other embodiments of the invention as will be appreciated by those skilled in the art.

Those other elements in FIGS. 7–10 labeled with prime notation are similar to those elements described above with respect to the twisted pair embodiment of the communications transceiver 25. Accordingly, these elements require no further description herein to those skilled in the art.

Figure 10:
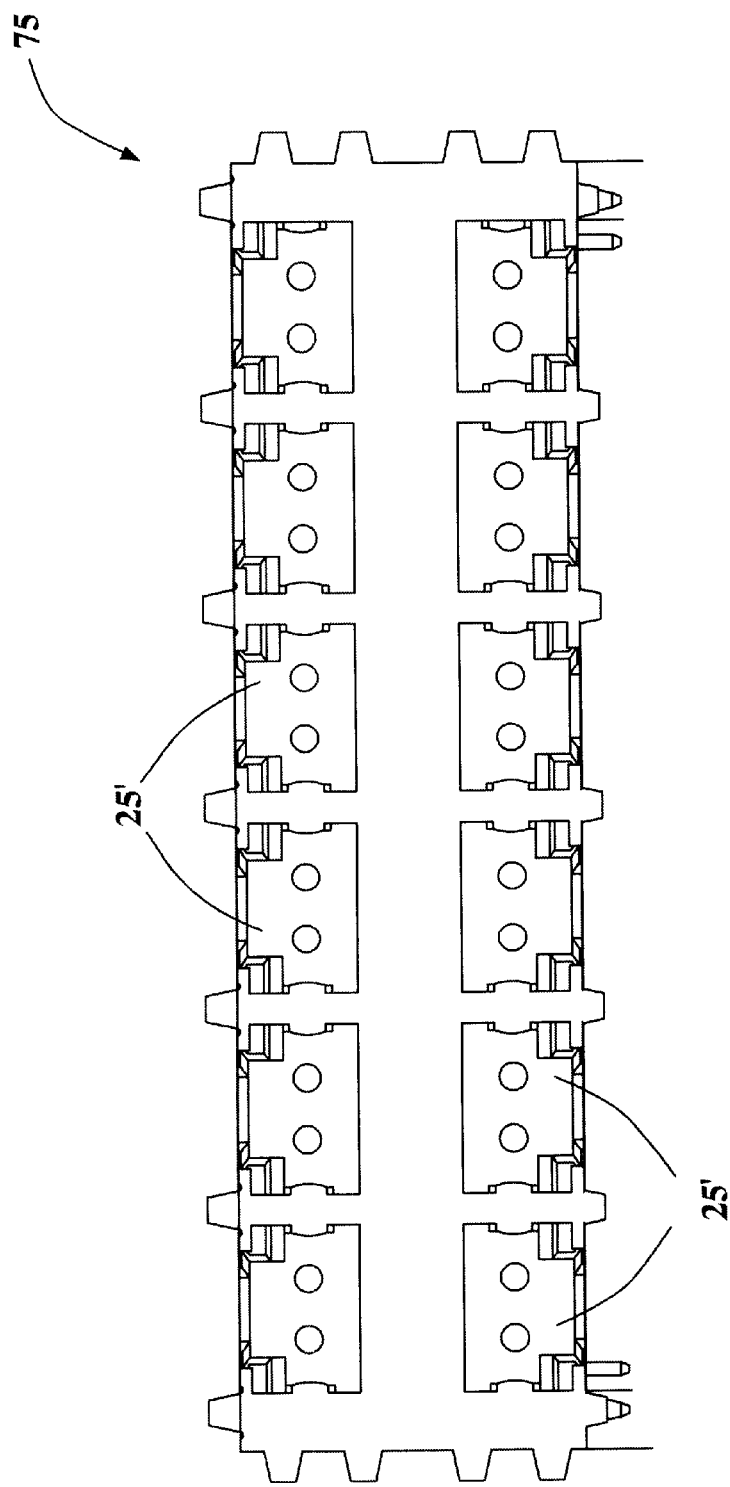
FIG. 10 is a front elevational view of another embodiment of an assembly of transceivers as shown in FIG. 7.

Turning now to FIG. 10 an assembly or module 75 of communications transceivers 25' is shown. The illustrated assembly 75 of transceivers 25' includes twelve transceivers arranged in upper and lower groups of six transceivers each. Such an assembly could be provided in other multiples, such as the quad-pack assembly illustrated in FIG. 1. Of course, those of skill in the art will appreciate that other configurations are also contemplated by the present invention.

Figure 11:
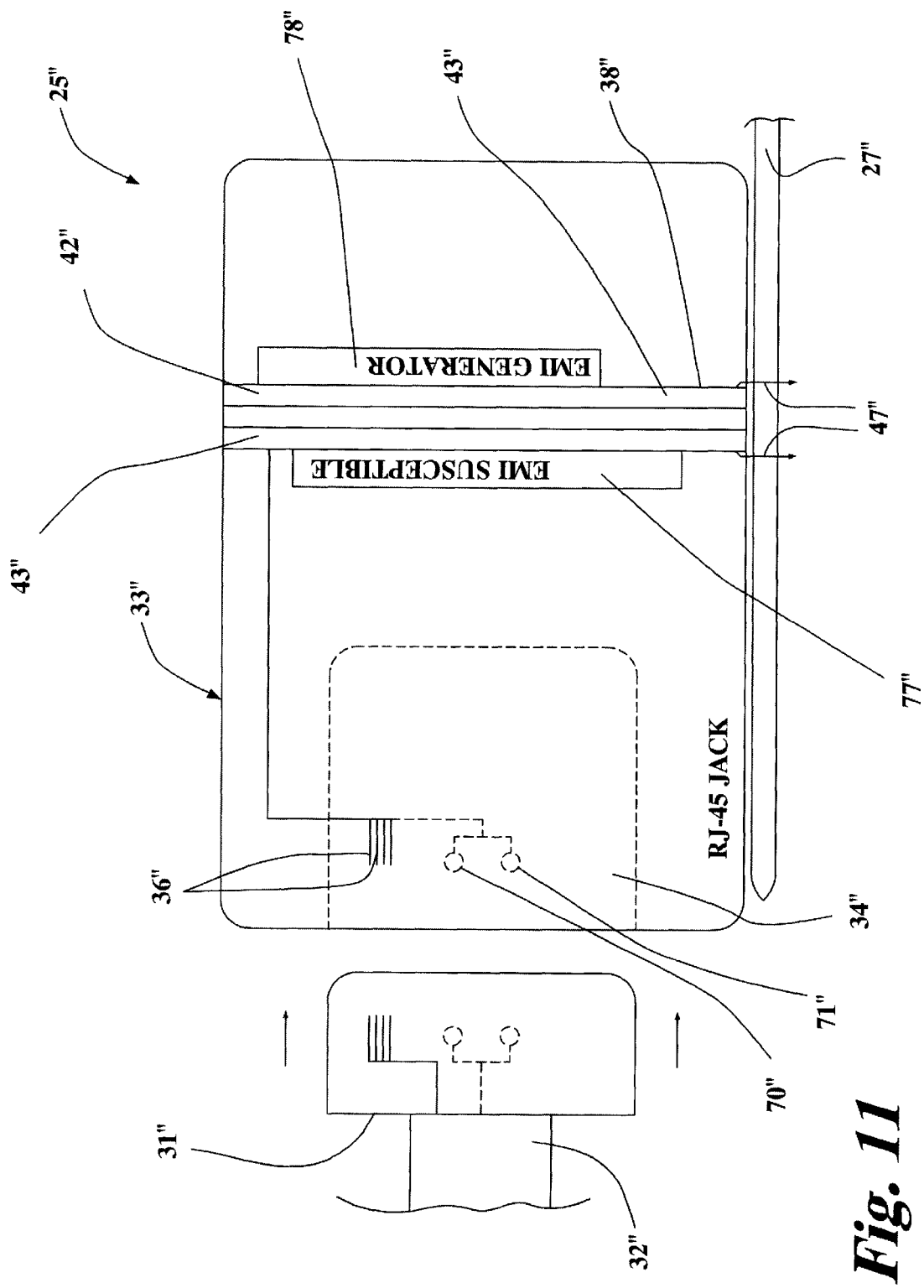
FIG. 11 is a schematic side view, partially in section, of another embodiment of the transceiver in accordance with the present invention.

Turning now additionally to schematic drawing of FIG. 11, the broad concepts of the invention are summarized, and are also applied to an embodiment compatible with an RJ-45 jack. In the illustrated embodiment, the transceiver 25" is mounted on a mother circuit board 27". The transceiver 25" includes a schematically illustrated generic first circuit device 77 that is susceptible to EMI, and a second generic circuit device 78 that is a generator of EMI. The first circuit device 77 is separated from the second circuit device 78 by the intervening EMI shield 42" which is advantageously provided as part of the circuit board 38". The EMI shield 42" is preferably connected to a ground on the mother circuit board 37" as will also be appreciated by those skilled in the art. The transceiver housing 33" is compatible with the RJ-45 jack as will be readily appreciated by those skilled in the art, and can receive the mating plug 31". Those other elements indicated with double prime notation are similar to those already described and need no further explanation.

A method aspect of the invention is for making a communications transceiver 25 of a type comprising a jack housing 33 including portions defining a recess 34 for receiving a mating plug 31 therein, signal connector means within the recess for establishing inbound and outbound signal paths with corresponding signal connector means of the mating plug, and a circuit board 38 within the jack housing and connected to the signal connector means. The method preferably comprises the steps of: providing the circuit board 38 with an electrically conductive layer 42 defining a first internal electromagnetic interference (EMI) shield; positioning at least one first circuit device, such as an active IC 45, being susceptible to EMI on a first side of the circuit board; and positioning at least one second circuit device generating EMI, such as the magnetics 60, on the circuit board on a second side thereof opposite the first side so that the first internal EMI shield extends between the at least one first circuit device and the at least one second circuit device.

The method may also include the steps of providing an electrically conductive layer 50 on outer surface portions of the jack housing 33 defining an external EMI shield, and electrically connecting the first internal EMI shield 42 to the external EMI shield 50. In one preferred embodiment, the jack housing 33 and output pins 47 are compatible with an RJ-45 jack.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. An optical transceiver RJ-jack, comprising:

an RJ-jack housing having a top side, a bottom side, a first side, a second side, a back side, and a front face, and a recess in the front face of the housing for receiving a mating plug therein;

an optical transmitter within the recess for transmitting optical signals to the mating plug to be located within the recess;

an optical detector within the recess for receiving optical signals from the mating plug to be located within the recess;

a circuit board mounted inside the housing, being substantially parallel to and spaced apart from the back side, and the circuit board extending to the top side, the bottom side, the first side, and the second side of the housing, thereby creating a sealed area between the circuit board and the back side of the housing;

an electromagnetic interference (EMI) shield on the circuit board;

a first circuit device having analog-to-digital conversion circuitry, being susceptible to EMI, and being mounted on first side of the circuit board facing the recess; and a second circuit device having a transformer generating EMI and being mounted to a second side of the circuit board facing the back side of the housing.

2. The optical transceiver RJ-jack of claim 1, wherein the housing comprises EMI shielding material, thereby containing EMI emitted from the second circuit device within the sealed area.

3. The optical transceiver RJ-jack of claim 2, wherein the EMI shielding material of the housing is provided by an external layer on the housing.

4. The optical transceiver RJ-jack of claim 2, wherein the EMI shielding material of the housing is provided by composition material of the housing.

5. The optical transceiver RJ-jack of claim 2, wherein the housing is made of metal and the EMI shielding material is provided by the metal composition of the housing.

6. The optical transceiver RJ-jack of claim 2, wherein the EMI shielding material of the housing is provided by an internal layer of the housing.

7. The optical transceiver RJ-jack of claim 2, wherein the EMI shield of the circuit board is provided by a layer on the first side of the circuit board.

8. The optical transceiver RJ-jack of claim 2, wherein the EMI shield of the circuit board is provided by a layer on the second side of the circuit board.

9. The optical transceiver RJ-jack of claim 2, wherein the EMI shield of the circuit board is provided by composition material of the circuit board.

* * * * *